United States Patent [19]
Kresge et al.

[11] Patent Number: 5,874,776
[45] Date of Patent: Feb. 23, 1999

[54] THERMAL STRESS RELIEVING SUBSTRATE

[75] Inventors: John S. Kresge, Binghamton; James R. Wilcox, Broome, both of N.Y.

[73] Assignee: International Business Machines Corporation, Armonk, N.Y.

[21] Appl. No.: 840,481

[22] Filed: Apr. 21, 1997

[51] Int. Cl.$^6$ .......................... H01L 23/48; H01L 23/52; H01L 29/40

[52] U.S. Cl. ............................................ 257/747; 257/731

[58] Field of Search ..................... 257/747, 731, 257/669; 438/50, 125, 121, 108

[56] References Cited

U.S. PATENT DOCUMENTS

| | | |
|---|---|---|
| 4,152,175 | 5/1979 | Burgess et al. ..................... 257/747 |
| 4,427,993 | 1/1984 | Fichot et al. .......................... 257/747 |
| 4,791,248 | 12/1988 | Oldenetel et al. . |
| 4,824,381 | 4/1989 | Hertzberg . |
| 4,994,903 | 2/1991 | Wroe et al. .......................... 257/747 |
| 5,012,324 | 4/1991 | Martin et al. . |
| 5,272,375 | 12/1993 | Belopolsky . |
| 5,422,788 | 6/1995 | Heinen . |

*Primary Examiner*—Mahshid Saadat
*Assistant Examiner*—S. V. Clark
*Attorney, Agent, or Firm*—Scully, Scott, Murphy & Presser; John R. Pivnichny

[57] ABSTRACT

A substrate for connecting one element having a first coefficient of thermal expansion to another element having a differing coefficient of thermal expansion that will alleviate interconnection problems due to thermal mismatch.

13 Claims, 1 Drawing Sheet

THERMAL STRESS RELIEVING SUBSTRATE

RELATED APPLICATION

This application is related to the following, commonly assigned, application:

U.S. patent application Ser. No. 08/840,518, entitled "ORGANIC CONTROLLED COLLAPSE CHIP CONNECTOR (C4) BALL GRID ARRAY (BGA) CHIP CARRIER WITH DUAL THERMAL EXPANSION RATES", filed concurrently with the present application.

BACKGROUND OF THE INVENTION

This invention relates in general to stress relieving elements and more particularly to a thermal stress relief plate or substrate adapted to join heat generating elements, i.e. a semiconductor chip and a printed circuit board.

It is a continuing need as set forth by U.S. Pat. No. 4,427,993 in a number of fields to provide stress relief elements for electrically or mechanically coupling differing heat generating devices. This has been desired in that thermal stress can cause fatigue at the interfaces of these elements after repetitive expansion and contraction during thermal cycling, i.e. a shearing in soldered joints, as explained in U.S. Pat. No. 4,824,381.

Each of the aforesaid patents attempt to suggest a solution to the problem of thermal stress management, and it is in the improvement of their efforts that this invention disclosure is made. In that regard it is an object of this invention to provide a thermal coefficient of expansion matching substrate for joining members that during use will produce differing coefficients of thermal expansion whereby the substrate will keep joint stress low to maintain low bonding strains at each interconnect level.

It is yet another object of this invention to construct a substrate for interconnecting multiple elements whose coefficient of thermal expansion may be easily varied to match an element having a coefficient of thermal expansion in an area thereof and also match another element having another coefficient of thermal expansion in another area thereof.

It is still further object of this invention to provide a member that can be constructed to allow for selection of its coefficient of thermal expansion in the plane of its matching surfaces with other heat transmissive elements to allow joinder thereof.

An additional object of this invention is to provide a thermal coefficient of expansion matching substrate or mounting member having a plurality of matching surfaces each having areas of an independently selectable thermal coefficient of expansion for joining a like plurality of dissimilar elements.

In preferred embodiment of this invention a composite substrate containing Invar material is adapted to join a silicon chip to a printed circuit board so as to accommodate the variations of the chip's and board's coefficients of thermal expansion.

BRIEF DESCRIPTION OF THE DRAWINGS

The features of the invention which are believed to be novel are pointed out with particularity in the appended claims. The invention itself, however, both as to its organization and method of construction together with further objects and advantages thereof may best be understood by reference to the following description taken in connection with the accompanying drawings in which:

DESCRIPTION OF INVENTION

Figure 1:
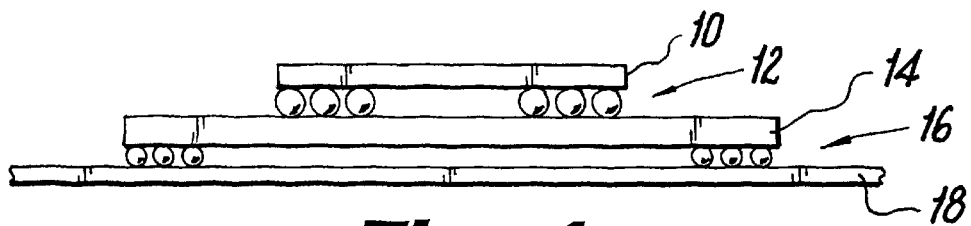
FIG. 1 is a schematic illustration of a flip-chip carrier with a ball grid array interconnect to a printed circuit board.

Referring now to FIG. 1 a prior art method of interconnecting a silicon chip 10 is shown mounted by a ball grid array 12 to a substrate 14 that in turn is mounted by another ball grid array 16 to a printed circuit board 18. In this assembly thermal expansion mismatch of the chip and board is accommodated by shear strain at both interconnect levels 12 and 16 with the shear strain at 12 being expressed by the formula:

$$\frac{(\alpha_2 - \alpha_1)\Delta T \delta_1}{h_1}$$

and the shear strain at 16 being expressed by the formula:

$$\frac{(\alpha_3 - \alpha_2)\Delta T \delta_2}{h_2}$$

with $\alpha_1$ being the Coefficient of Thermal Expansion (CTE) of the silicon chip 10

$\alpha_2$ being the CTE of the substrate 14

$\alpha_3$ being the CTE of the Printed Circuit Board (PC) 18

$\delta_1$ the distance from the chip 10's center to the outer most solder connection i.e. the distance to Neutral Point (DNP)

$\delta_2$ being the distance from the center of substrate 14 to the outer most solder connection $h_1$ being the height of BGA 12

$h_2$ being the height of BGA 16 and $\Delta T$ being the maximum range of temperature experienced by the assembly.

In this prior art assembly the accommodation of thermal mismatch is done by constructing substrate 14 with a CTE intermediate that of chip 10 and board 18, e.g. by inclusion of one or more low CTE metal compensator planes in substrate 14.

As a silicon chips continue to increase in size and Input/Output (I/O) count, the size of the carrier (substrate) must also increase to provide sufficient I/O escape. It is believed that this prior art accommodation of differing thermal expansion of elements joined by such a substrate will eventually become inadequate, e.g. increasing the DNP at each level of arrays 12 and 16 will eventually increase the thermally induced solder joint strains to the point where intermediate substrate 14's CTE cannot simultaneously maintain sufficiently low solder strains at each interconnect level to avoid failure.

Figure 2:
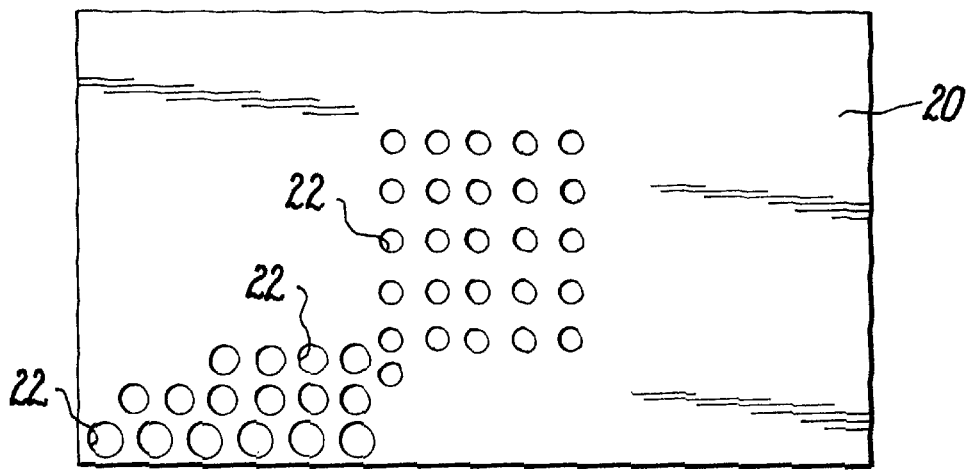
FIG. 2 is an overhead view of a compensation plate constructed in accordance with this invention.

In answer to this problem this invention suggests an improved construction for a compensator plate 20 shown in FIG. 2. In this preferred embodiment the compensator plate is made from Invar material as has been suggested by the prior art referenced above. However, such compensator plate 20 is formed with a compensator hole pattern 22 to vary its in-plane stiffness from the area 24 where a chip 10 may be located to a peripheral interconnect area 26 with the PCB. It was found by this method of reducing the compensator plates density (in-plane stiffness), that the compensator plate's ability to influence the composite CTE is reduced, e.g. if only a small area fraction of the CTE compensator plane is removed (such as with small or widely spaced clearance holes) a significant reduction in composite CTE is possible; and, if on-the-other hand the compensator plate 20 contains very large, closely placed holes its effect on CTE will be slight.

As shown in FIG. 2 a controlled variation in composite CTE, i.e. low under chip 10 and higher at the edge above the PCB 18, is accomplished in accordance with this invention by a mixture of varied hole sizing and spacing. Such a construction can be obtained by drilling or etching a desired hole pattern that will accommodate the differing shear strains in the flip chip solder joints and the BGA card attach solder joints. In the preferred method of hole pattern fabrication a gradual decrease in stiffness (or increase in fractional hole area) with increasing distance from a heat generating element area can be accomplished by keeping hole pitch constant and systematically increasing the hole diameter, as shown in FIG. 2. It has been found that one could also achieve these results using a constant hole diameter and steadily decreasing hole pitch, i.e. the distance between hole centers.

Figure 3:
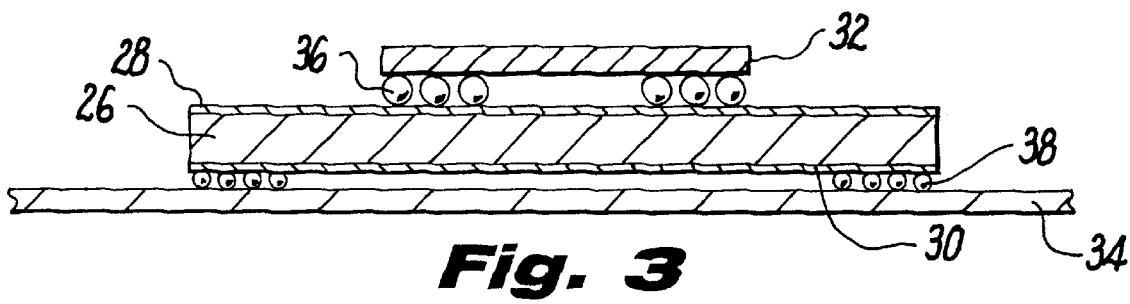
FIG. 3 is a cross sectional view of a composite substrate mounting a silicon chip to a printed circuit board using a ball grid array interconnect therebetween.

It has also been found that the maximum range of CTE possible within a given compensator plane could also depend on laminate construction and that this invention can accommodate any maximum range of CTE possibilities by better allowing for the factors of (1) stiffness of the uncompensated composite, (2) elastic modulus of the low CTE compensator metal, and (3) the total thickness of all compensator plates in a structure. FIG. 3 shows a schematic laminate cross section where a compensator plate 26 is positioned between copper plates 28 and 30 connected to the chip 32 and PCB 34 by solder balls 36 and 38, which too may be varied in size.

Figure 4:
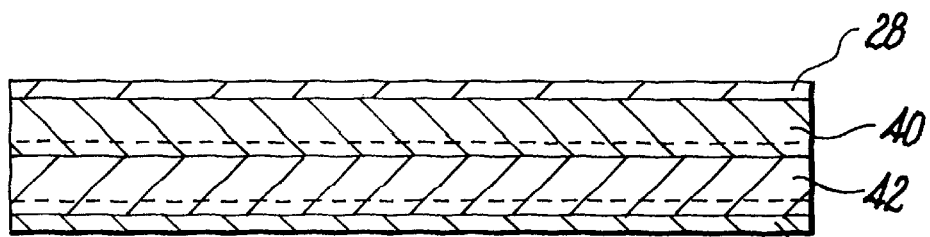
FIG. 4 is a cross sectional view of a composite substrate according to this invention with multiple layers.

Alternatively, FIG. 4 shows a cross section with dual compensator plates 40 and 42 to take a variable clearance hole pattern to an extreme to give maximum variation in CTE, e.g. the holes near the compensator plate perimeter can be enlarged to the point of overlapping and beyond. It is to be noted that if the compensator plate is to be simply mechanical without any electrical function there would be no requirement for a continuous plane of material.

While the invention has been particularly shown and described with reference to several preferred embodiments thereof it will be understood by those skilled in the art that various changes in form and detail may be made therein without departing from the true spirit and scope of the invention as defined by the appended claims.

We claim:

1. A chip carrier comprising: a substrate with a coefficient of thermal expansion compensation plate having means to provide a variable in-plane stiffness to accommodate thermal expansion mismatch between elements on the substrate to either side of the compensation plate.

2. A chip carrier comprises: a substrate with a coefficient of thermal expansion plate having means to provide a variable in-plane stiffness to accommodate thermal expansion mismatch of elements attached to said substrate.

3. A thermal stress relieving device comprising: a plate constructed so as to have a variable in-plane stiffness from its inner areas to its outer periphery.

4. The device of claim 3 wherein said plate is further characterized in having a increased stiffness at its inner area and a gradually decreasing stiffness from said inner area to its outer periphery.

5. The device of claim 3 having means to vary the density of material in said plate in a portion thereof in relation to that in said plate in other portions thereof.

6. The device of claim 5 wherein said means to vary the density of material are holes through said plate having a controlled variation in hole size and spacing.

7. The device of claim 6 wherein said holes are at a constant hole pitch and have a systematically increasing hole diameter.

8. The device of claim 6 wherein said holes have a constant diameter and a steadily decreasing hole pitch.

9. A method to reduce the thermal expansion mismatch between one element and a second element, said method comprising the steps of: constructing a substrate using a low coefficient of thermal expansion plate, determining the coefficient of thermal expansion of said one element and said second element, selectively removing portions of the plate so that the in-plane stiffness of said plate will constrain the thermal expansion of the substrate differently in respective areas of attachment of said one element and said second element.

10. The method of claim 9 and further characterized by forming holes through said compensator plate by maintaining hole pitch constant and systematically increasing hole diameter from the compensator plate's inner area toward the compensator plate's periphery.

11. The method of claim 9 and further characterized by forming holes through said compensator plate by steadily decreasing hole pitch of constant diameter holes from one portion of the compensator plate to another portion of the compensator plate.

12. The method of claim 9 and further characterized by drilling to remove portions of the compensator plate.

13. The method of claim 9 and further characterized by etching preselected hole patterns in said compensator plate.

* * * * *